(12) United States Patent
Kasai (10) Patent No.: US 6,864,863 B2
(45) Date of Patent: Mar. 8, 2005

(54) DRIVING CIRCUIT INCLUDING ORGANIC ELECTROLUMINESCENT ELEMENT, ELECTRONIC EQUIPMENT, AND ELECTRO-OPTICAL DEVICE

(75) Inventor: Toshiyuki Kasai, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 152 days.

(21) Appl. No.: 09/973,847

(22) Filed: Oct. 11, 2001

(65) Prior Publication Data

US 2002/0050962 A1 May 2, 2002

(30) Foreign Application Priority Data

Oct. 12, 2000 (JP) .......................................... 2000-312391
Oct. 11, 2001 (JP) .......................................... 2001-313951

(51) Int. Cl.[7] .................................................. G09G 3/14
(52) U.S. Cl. .......................................... 345/39; 345/45
(58) Field of Search ............................. 345/39, 42, 45, 345/46, 76, 82

(56) References Cited

U.S. PATENT DOCUMENTS

| | | | | | |
|---|---|---|---|---|---|
| 5,844,368 | A | * | 12/1998 | Okuda et al. ............ | 315/169.3 |
| 5,923,309 | A | * | 7/1999 | Ishizuka et al. ............... | 345/82 |
| 5,949,186 | A | * | 9/1999 | Nagayama et al. .......... | 313/504 |
| 6,023,259 | A | * | 2/2000 | Howard et al. ................ | 345/76 |
| 6,191,764 | B1 | | 2/2001 | Kono et al. | |
| 6,376,994 | B1 | * | 4/2002 | Ochi et al. ................ | 315/169.1 |
| 6,380,689 | B1 | * | 4/2002 | Okuda ...................... | 315/169.3 |

FOREIGN PATENT DOCUMENTS

| | | |
|---|---|---|
| EP | 0 883 191 A2 | 12/1998 |
| EP | 1 094 438 A1 | 4/2001 |
| JP | 10-288965 | 10/1998 |
| JP | A-11-8064 | 1/1999 |
| JP | A-11-272233 | 10/1999 |
| JP | A 2000-268957 | 9/2000 |
| JP | 2000-268957 | 9/2000 |
| KR | 1999-30880 | 7/1999 |
| WO | WO 99/53472 | 10/1999 |

OTHER PUBLICATIONS

R.M.A. Dawson et al., "The Impact of the Transient Response or Organic Light Emitting Diodes on the Design of Active Matrix OLED Displays", 1998 *IEEE,* IEDM 98, pp. 875–878.

\* cited by examiner

*Primary Examiner*—Guy J. Lamarre
*Assistant Examiner*—Fritz Alphonse
(74) *Attorney, Agent, or Firm*—Oliff & Berridge, PLC (57) ABSTRACT

The invention provides an organic electroluminescent element driving circuit to which a reverse-bias is applied, which does not require a substantial increase in power consumption an increase in layout space.

With switches arranged, electroluminescent elements are set to be in a reverse-bias state. The pixels are reverse-biased on the basis of a group of predetermined pixels at a time, for example, the pixels are reverse-biased on a pixel-by-pixel basis or on a line-by-line basis, or all pixels are reverse-biased at a time. In this way, reverse bias can be applied without the need for an additional power source, and without requiring a substantial increase in power consumption nor an increase in layout space. The service life of the organic electroluminescent element can thus be prolonged.

22 Claims, 13 Drawing Sheets

DRIVING CIRCUIT INCLUDING ORGANIC ELECTROLUMINESCENT ELEMENT, ELECTRONIC EQUIPMENT, AND ELECTRO-OPTICAL DEVICE

BACKGROUND OF THE INVENTION

1. Field of Invention

The present invention relates to a driving circuit that drives an active-matrix display device employing organic electroluminescent elements, and electronic equipment and an electro-optical device, incorporating the driving circuit. More particularly, the invention relates to a driving circuit having the function of applying a reverse-bias voltage to an organic electroluminescent element that controls degradation of the organic electroluminescent element, and electronic equipment and an electro-optical device, incorporating the driving circuit.

2. Description of Related Art

It is known that an organic EL display device is produced by arranging a plurality of pixels of organic electroluminescent elements, i.e., one of electro-optical elements, in a matrix. The organic electroluminescent element includes a metal electrode of Mg:Ag or Al:Li, etc., as a cathode, a transparent electrode, such as an ITO (Indium Tin Oxide) as an anode, and an organic thin-film laminate, including an emission layer, interposed between the cathode and the anode.

Figure 9:
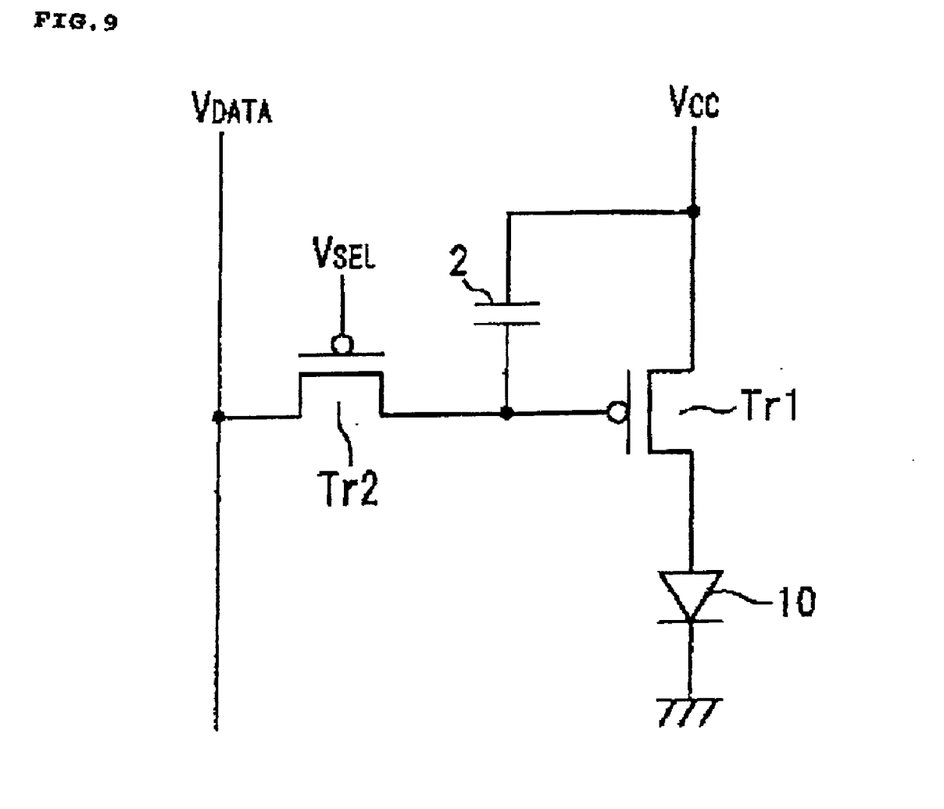
FIG. 9 is a schematic showing the structure of a conventional organic electroluminescent element driving circuit.

FIG. 9 shows a typical driving circuit for an active matrix display device employing an organic electroluminescent element. Referring to FIG. 9, the organic electroluminescent element is shown as a diode 10. The driving circuit is composed of transistors Tr 1 and Tr 2, each constructed of a thin-film transistor (TFT), and a capacitive element 2 storing charge.

Both the transistor Tr 1 and the transistor Tr 2 are of a p-channel TFT. The conduction state of the transistor Tr 1 is controlled in response to a charge stored in the capacitive element 2 as shown. The capacitive element 2 is charged through a data line $V_{DATA}$ by the transistor Tr 2, which is turned on with a selection voltage $V_{SEL}$ driven low. When the transistor Tr 1 is turned on, a current flows through the electroluminescent element 10 from the transistor Tr 1. With the current flowing therethrough, the electroluminescent element 10 continuously emits light.

Figure 10:
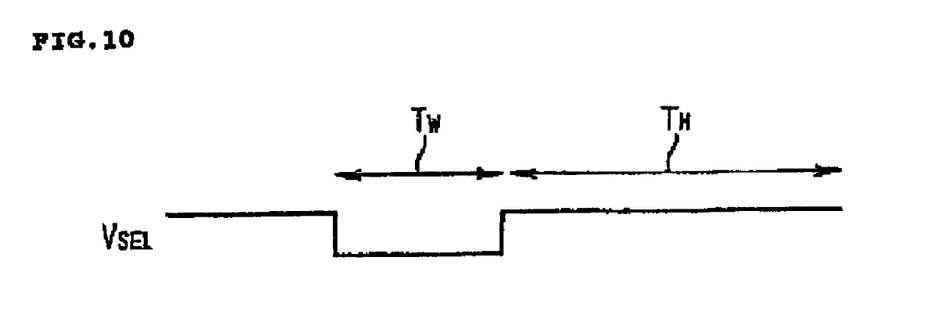
FIG. 10 is a waveform diagram showing the operation of the organic electroluminescent element driving circuit shown in FIG. 9.

FIG. 10 shows a simple timing diagram for the circuit shown in FIG. 9. When data is written, the selection voltage $V_{SEL}$ is driven low as shown FIG. 10. The transistor Tr 2 is turned on, thus charging the capacitive element 2. The charge duration is a write period $T_W$. An actual presentation period follows the write period $T_W$. During the presentation period, charge stored in the capacitive element 2 controls the conduction state of the transistor Tr 1. The presentation period is represented by $T_H$ as shown.

Figure 11:
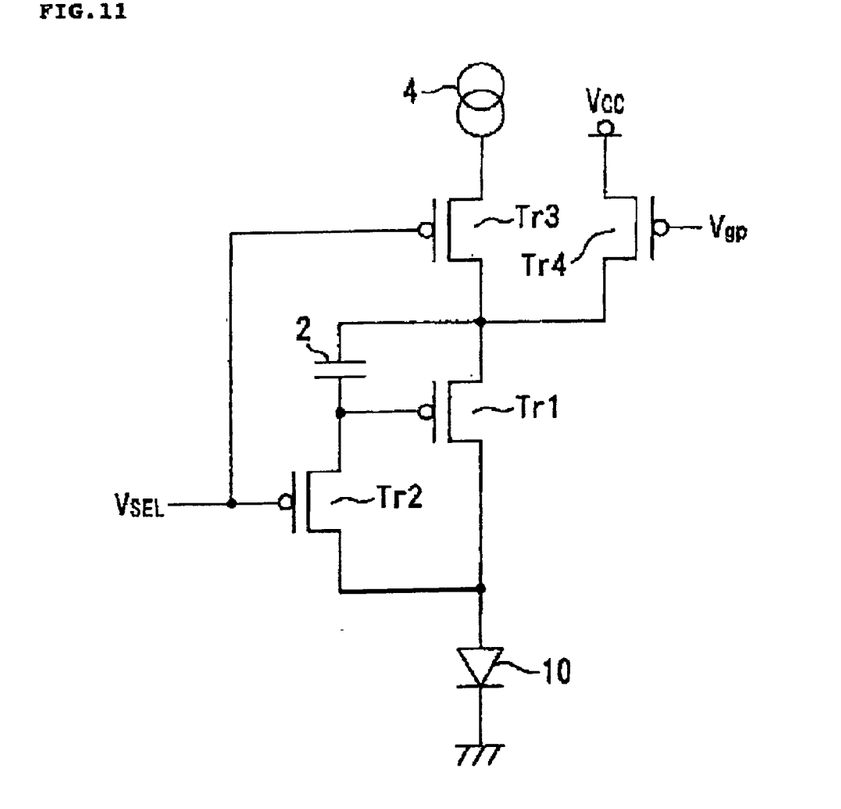
FIG. 11 is a schematic showing the structure of another conventional organic electroluminescent element driving circuit.

FIG. 11 shows another arrangement of the organic electroluminescent element driving circuit. The driving circuit shown is described in a paper entitled "The Impact of Transient Response of Organic Light Emitting Diodes on the Design of Active Matrix OLED Displays" (1998 IEEE IEDM98–875). Referring to FIG. 11, there are shown a driving transistor Tr 1, a charge control transistor Tr 2, a first selection transistor Tr 3, and a second selection transistor Tr 4 which is turned off during a charging period of the capacitive element 2.

As is known, transistors, even complying with the same specifications, suffer variations in performance. Even when the same voltage is applied to the gates of transistors, these transistors do not necessarily permit current of equal values to flow therethrough. Such variations cause nonuniformity in brightness. In the driving circuit, a current source 4 feeds a write current corresponding to a data signal, and the data signal thus controls the gate voltage of the transistor. In this way, the emission state of the organic electroluminescent element is controlled.

Transistors Tr 1 through Tr 4 are all of a p-type channel transistor. When the selection voltage $V_{SEL}$ is driven low, the transistors Tr 2 and Tr 3 are turned on, thereby storing, in the capacitive element 2, a charge corresponding to the value of the output of the current source 4. When the selection voltage $V_{SEL}$ is driven high, the transistors Tr 2 and Tr 3 are turned off. The conduction state of the transistor Tr 1 is thus controlled by the charge stored in the capacitive element 2. With a data hold control signal $V_{gp}$ turning on the transistor Tr 4, an electroluminescent element 10 is supplied with a current corresponding to the charge stored in the capacitive element 2. This duration of time is a presentation period $T_H$.

Figure 12:
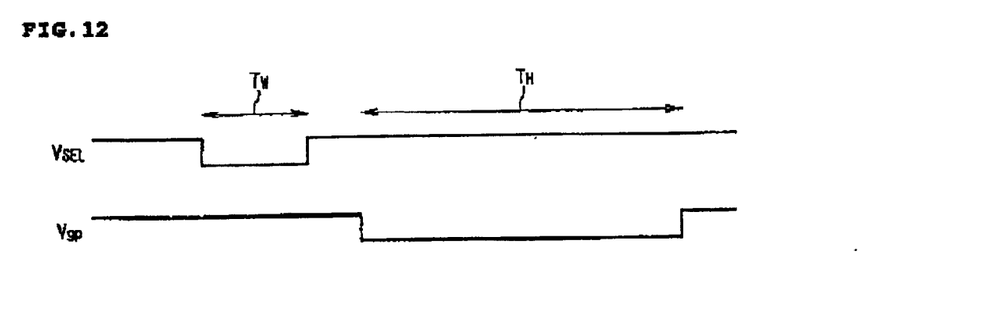
FIG. 12 is a waveform diagram showing the operation of the organic electroluminescent element driving circuit shown in FIG. 11.

FIG. 12 shows a simple timing diagram of the circuit shown in FIG. 11. When data writing is performed by the current source 4 as shown in FIG. 12, the selection voltage $V_{SEL}$ is driven low, thereby turning on the transistors Tr 2 and Tr 3. The capacitive element 2 is thus charged. The charge period equals a write period $T_W$. With the selection voltage $V_{SEL}$ driven high, the transistors Tr 2 and Tr 3 are turned off. With the data hold control signal $V_{gp}$ driven low, the conduction state of the transistor Tr 1 is determined based on the charge stored in the capacitive element 2. The electroluminescent element 10 is supplied with a current corresponding to the charge stored in the capacitive element 2. This duration of time is a presentation period $T_H$.

Figure 13:
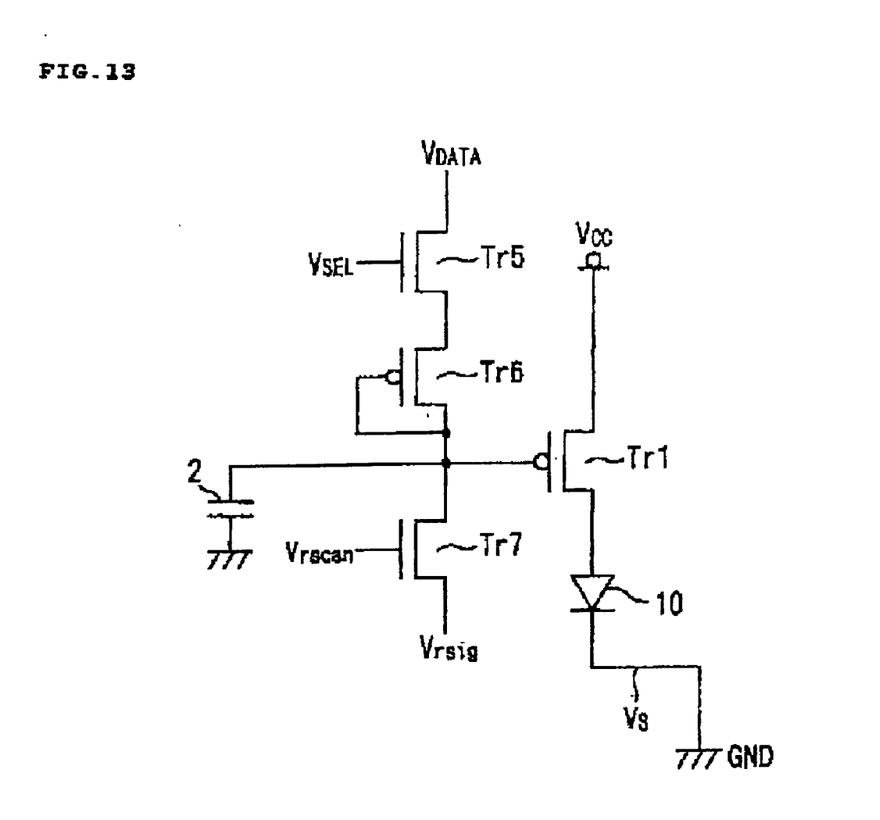
FIG. 13 is a schematic showing the structure of yet another conventional organic electroluminescent element driving circuit.

FIG. 13 shows another driving circuit of an organic electroluminescent element. The driving circuit shown here is disclosed in Japanese Unexamined Patent Application Publication No. 11-272233. As shown, the driving circuit includes a driving transistor Tr 1 which supplies an electroluminescent element 10 with a current from a power source during the on state thereof, a capacitive element 2 which stores a charge for controlling the conduction state of the transistor Tr 1, and a charge control transistor Tr 5 which controls the charging of the capacitive element 2 in response to an external signal. A voltage $V_{rscan}$ is driven low to turn off a charge control transistor Tr 7 to cause the electroluminescent element 10 to emit light, and then, a reset signal $V_{rsig}$ is not output. A transistor Tr 6 is included for adjustment purposes.

Figure 14:
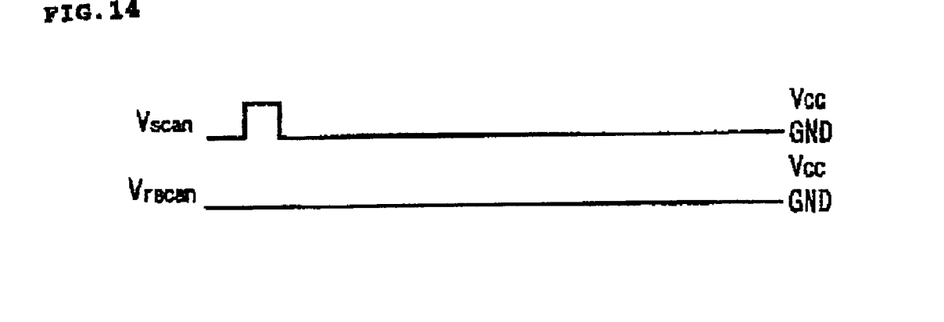
FIG. 14 is a waveform diagram showing the operation of the organic electroluminescent element driving circuit shown in FIG. 13.

When the electroluminescent element 10 emits light in the driving circuit, the transistor Tr 5 is turned on, and the capacitive element 2 is charged by a transistor Tr 6 through a data line $V_{DATA}$. Conductance between the source and drain of the transistor Tr 1 is controlled in response to a charge level of the capacitive element 2 to allow a current to flow through the electroluminescent element 10. Referring to FIG. 14, when the voltage $V_{scan}$ is driven high to turn on the transistor Tr 5, the capacitive element 2 is charged through the transistor Tr 6. Conductance between the source and drain of the transistor Tr 1 is controlled in response to a charge level of the capacitive element 2 to allow a current to flow through the electroluminescent element 10.

Reverse-biasing the organic electroluminescent element is known as an effective way to prolong the service life of the organic electroluminescent element. For example, Japanese Unexamined Patent Application Publication No. 11-8064 discloses a technique for prolonging the service life of the organic electroluminescent element.

To reverse-bias the organic electroluminescent element using the disclosed technique, an additional power source for a negative voltage needs to be prepared and controlled to reverse-bias the organic electroluminescent element.

SUMMARY OF THE INVENTION

It is an object of the present invention to provide a driving circuit, that drives an organic electroluminescent element, and which supplies the organic electroluminescent element with a reverse bias without involving an increase in power consumption and a cost increase. It is also an object of the invention to provide an electronic equipment and an electro-optical device that incorporate the driving circuit.

A first driving circuit of the present invention driven organic electroluminescent display device in which a plurality of pixels, each containing an organic electroluminescent element, is arranged in a matrix. The first driving circuit includes a reverse-bias setting circuit which sets the organic electroluminescent elements in a reverse-bias state on an area-by-area basis.

A second driving circuit of the present invention drives an organic electroluminescent display device in which a plurality of pixels, each containing an organic electroluminescent element, is arranged in a matrix. The second driving circuit includes a reverse-bias setting circuit which sets organic electroluminescent elements contained in a predetermined area, from among the organic electroluminescent elements, in a reverse-bias state.

In a third driving circuit of the present invention, the reverse-bias setting circuit includes a switch which switches an electrical connection state of at least one of electrodes of each of the organic electroluminescent elements between being connected to a first power source line that supplies a first voltage and being connected to a second power source line that supplies a second voltage that is lower in level than the first voltage.

Since the switch is used to switch the connection state of the driving circuit between being connected to a first power source and a second power source, no additional power is required. Without involving an increase in power consumption and a cost increase, a reverse-bias is supplied to the organic electroluminescent element. In this case, typically, the first power source is Vcc, and the second power source is ground (GND). These are existing power sources. The present invention is not limited to this arrangement, as long as a voltage difference that is large enough to cause the organic electroluminescent element to emit light is used.

In a fourth driving circuit of the present invention, the reverse-bias setting circuit includes a switch which switches an electrical connection state of a cathode of each of the organic electroluminescent elements between being connected to a first power source line that supplies a first voltage and being connected to a second power source line that supplies a second voltage that is lower in level than the first voltage.

In a fifth driving circuit of the present invention, the switches are arranged with one switch for each pixel, and the organic electroluminescent elements are set to be in a reverse-bias state on a pixel-by-pixel basis by controlling the switches.

In a sixth driving circuit of the present invention, the switches are arranged with one switch for each line of pixels, and the organic electroluminescent elements are set to be in a reverse-bias state on a line-by-line basis by controlling the switches.

In a seventh driving circuit of the present invention, the switch is arranged with the single switch for all pixels, and the organic electroluminescent element of all pixels are set to be in a reverse-bias state by controlling the switch.

In an eighth driving circuit of the present invention, the switches are arranged with one switch for each of particular pixels, and the organic electroluminescent elements of the particular pixels are set to be in a reverse-bias state by controlling the switches.

A ninth driving circuit of the present invention drives an electro-optical device in which a plurality of electro-optical elements is arranged in a matrix, and includes a reverse-bias setting circuit which sets at least one of the electro-optical elements in a reverse-bias state.

A first electronic equipment of the present invention includes an active-matrix display device including the driving circuit.

A first electro-optical device of the present invention includes a driving circuit that actively drives a display device in which a plurality of pixels, each including an electro-optical element, is arranged in a matrix. The driving circuit includes a reverse-bias setting circuit which sets the electro-optical elements in a reverse-bias state on an area-by-area basis.

A second electro-optical device of the present invention includes a driving circuit that drives a display device in which a plurality of pixels, each including an electro-optical element, is arranged in a matrix. The driving circuit includes a reverse-bias setting circuit which sets electro-optical elements contained in a predetermined area, from among the electro-optical elements, in a reverse-bias state.

In a third electro-optical device of the present invention, the reverse-bias setting circuit includes a switch which switches an electrical connection state of at least one of electrodes of each of the electro-optical elements between being connected to a first power source line that supplies a first voltage and being connected to a second power source line that supplies a second voltage that is lower in level than the first voltage.

In a fourth electro-optical device of the present invention, the reverse-bias setting circuit includes a switch which switches an electrical connection state of a cathode of each of the electro-optical elements between being connected to a first power source line that supplies a first voltage and being connected to a second power source line that supplies a second voltage that is lower in level than the first voltage.

In a fifth electro-optical device of the present invention, the switches are arranged with one switch for each pixel, and the electro-optical elements are set to be in a reverse-bias state on a pixel-by-pixel basis by controlling the switches.

In a sixth electro-optical device of the present invention, the switches are arranged with one switch for each line of pixels, and the electro-optical elements are set to be in a reverse-bias state on a line-by-line basis by controlling the switches.

In a seventh electro-optical device of the present invention, the switch is arranged with the single switch for all pixels, and the organic electroluminescent elements of all pixels are set to be in a reverse-bias state by controlling the switch.

In an eighth electro-optical device of the present invention, the switches are arranged with one switch for each of particular pixels, and the electro-optical elements of the particular pixels are set to be in a reverse-bias state by controlling the switches.

A ninth electro-optical device of the present invention includes a driving circuit that drives a matrix of electro-optical elements. The driving circuit includes a reverse-bias setting circuit which sets at least one of the plurality of electro-optical elements in a reverse-bias state on an area-by-area basis.

In a tenth electro-optical device of the present invention, the electro-optical element is an organic electroluminescent element.

DETAILED DESCRIPTION OF PREFERRED EMBODIMENTS

The embodiments of the present invention will now be discussed, referring to the accompanying drawings. Similar components are identified with similar reference numerals throughout the drawings.

(1) Application of a Reverse-Bias Voltage to a Conventional Driving Circuit

A) Application of a Reverse-Bias Voltage to the Circuit Shown in FIG. 9

Figure 2:
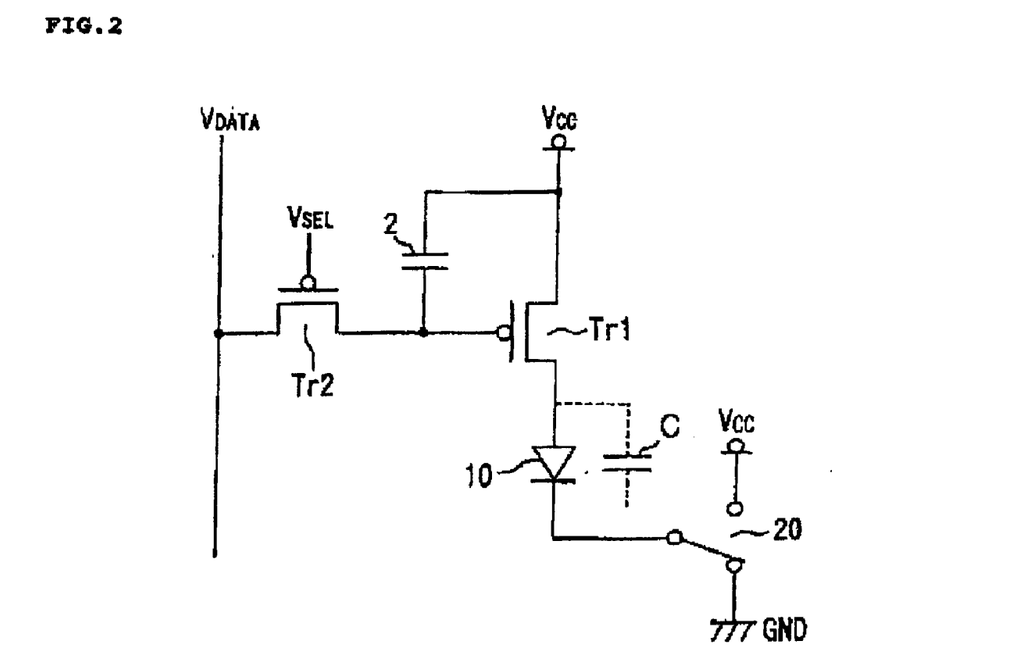
FIG. 2 is a schematic showing the structure of the organic electroluminescent element driving circuit of the present invention.

FIG. 2 is a circuit diagram showing one embodiment of a driving circuit for an active-matrix display device that incorporates organic electroluminescent elements. Referring to FIG. 2, the organic electroluminescent element driving circuit of this embodiment includes a switch 20 which switches the connection of the cathode of each organic electroluminescent element from a second potential (GND) to a first potential (Vcc). To cause the organic electroluminescent element 10 to emit light, the switch 20 is simply connected to the second potential (Vcc). This state is identical to the state shown in FIG. 9.

To apply a reverse bias to the organic electroluminescent element 10, the transistor Tr 1 is turned off and the switch 20 is set to connect the organic electroluminescent element 10 to the first potential (Vcc). Since the anode of the organic electroluminescent element 10 cannot be higher than the first potential (Vcc), the organic electroluminescent element 10 is reverse-biased.

When the parasitic capacitance C of the anode of the organic electroluminescent element 10 is small, the anode of the organic electroluminescent element 10 rises in potential in response to a potential change in the cathode of the organic electroluminescent element 10, i.e., a potential rise from the second voltage (GND) to the first voltage (Vcc). As a result, the organic electroluminescent element 10 cannot be applied with a sufficient reverse-bias voltage. To apply a sufficient reverse-bias voltage, a potential rise in the anode side must be restricted. Increasing a wiring parasitic capacitance C on the anode side is contemplated as a mechanism to control the potential rise. A large reverse-bias voltage can be applied by increasing the parasitic capacitance C on the anode side, and degradation of the organic electroluminescent element 10 is thus effectively controlled.

Figure 3:
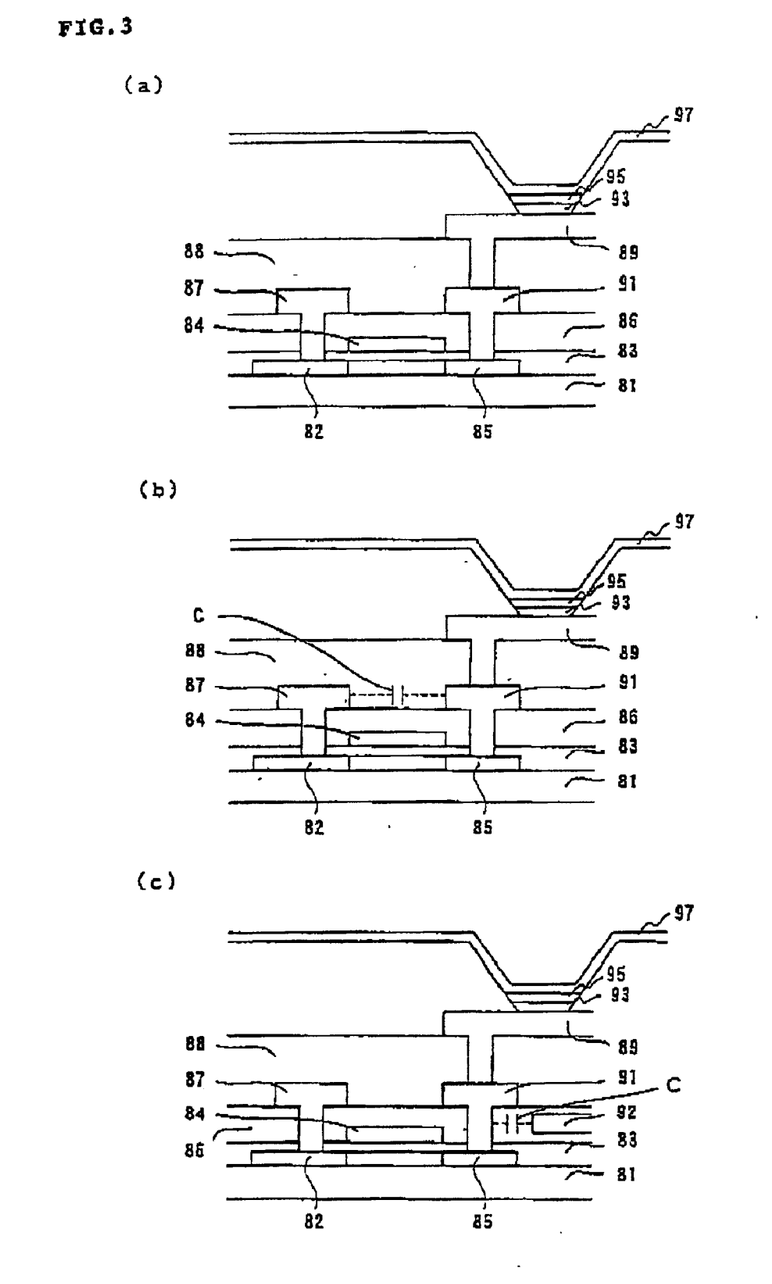
FIGS. 3(a)–3(c) is a cross-sectional view of a pixel circuit in the organic electroluminescent element driving circuit of the present invention.

A method of increasing the parasitic capacitance on the anode will now be discussed, referring to FIGS. 3(a)–3(c). A typical cross-sectional structure of the organic electroluminescent element is first discussed, referring to FIG. 3(a).

A semiconductor thin film is formed on a glass substrate 81. A source region 82 and a drain region 85 of a transistor are formed within the semiconductor thin film. A gate insulator layer 83 covers the source region 82 and the drain region 85 of the transistor. A gate electrode 84 is formed on the gate insulator layer 83. A first interlayer insulator 86 covers the gate electrode 84 and the gate insulator layer 83. Connection holes are drilled in the gate insulator layer 83 and the first interlayer insulator 86. The source region 82 and the drain region 85 are respectively connected to a source electrode 87 and a drain electrode 91 by filling the respective connection holes with an electrically conductive material. A second interlayer insulator 88 covers the source electrode 87, the drain electrode 91, and the first interlayer insulator 86. The drain electrode 91 is connected to an organic thin-film laminate, including an emission layer 95, through the anode 89 constructed of ITO. The organic thin-film laminate includes at least a hole injection layer 93 and the emission layer 95. A cathode 97 of the organic electroluminescent element is formed on the organic thin-film laminate. The switch 20 switches the potential of the cathode 97 from the second potential (GND) to the first potential (Vcc).

The method of increasing the parasitic capacitance on the anode will now be detailed.

(i) Parasitic Capacitance Between the Source Electrode and the Drain Electrode

A conductive member is arranged in the vicinity of wiring between the anode 89 of the organic electroluminescent element and the transistor to form a parasitic capacitance to the wiring. Specifically, referring to FIG. 3(b), the parasitic capacitance C is increased by setting the separation between the source electrode 87 and the drain electrode 91 to be narrower than a typical distance, or by setting facing areas of these electrodes to be larger than the remaining areas. In other words, the parasitic capacitance C is set up between the source electrode and the drain electrode of the driving transistor.

(ii) Parasitic Capacitance with a Metal Layer Arranged within the Insulator

Referring to FIG. 3(c), a metal layer 92 is arranged within the first interlayer insulator 86 to increase a parasitic capacitance between the metal layer 92 and the drain electrode 91. Specifically, the parasitic capacitance C is set up between the metal layer 92 that is arranged within the first interlayer insulator 86 and the drain electrode 91.

By simply resetting the switch 20, the organic electroluminescent element is placed into an emission state or a reverse-bias state. No extra negative-voltage power source is required. This arrangement does not involve an increase in power consumption or additional space. The switch 20 is easily constructed by combining a transistor.

B) Application of a Reverse-Bias Voltage in the Circuit Shown in FIG. 11

Figure 4:
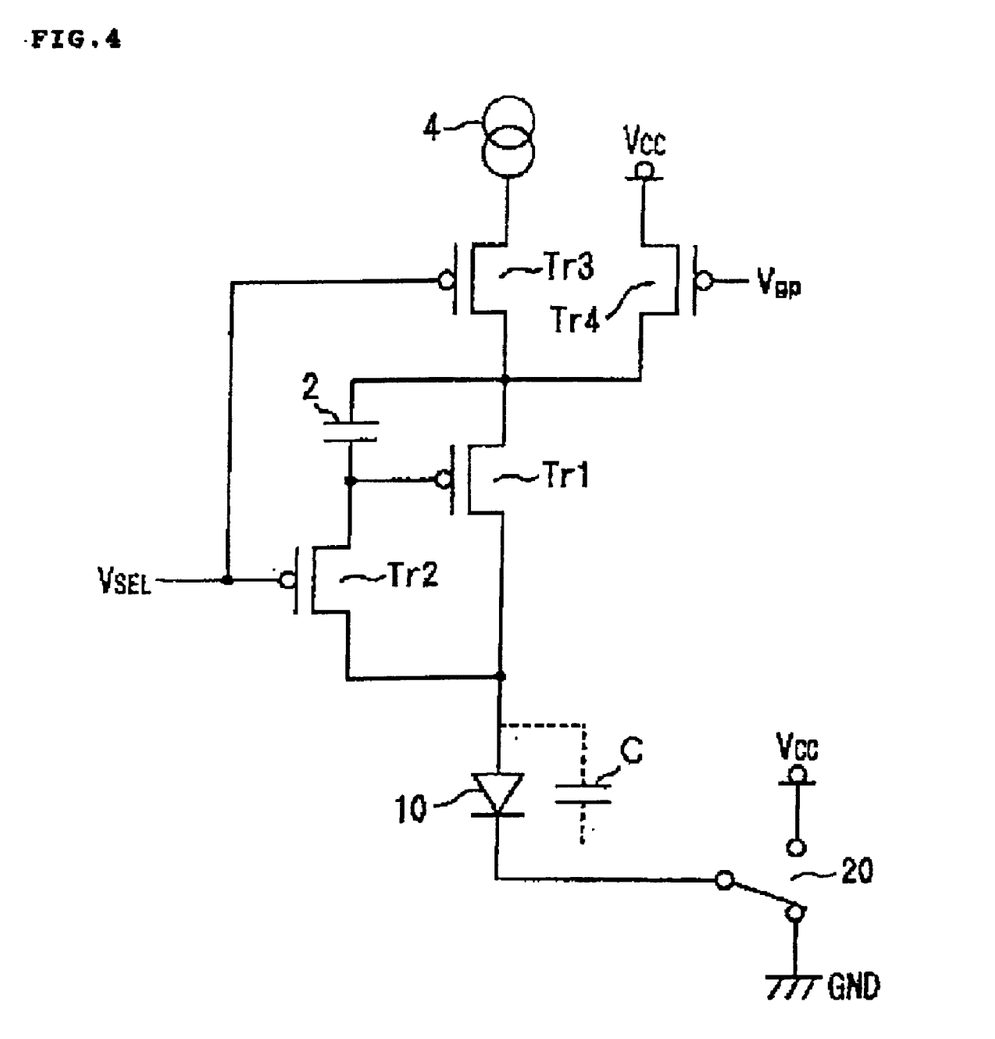
FIG. 4 is a schematic showing another arrangement of the organic electroluminescent element driving circuit of the present invention.

Referring to FIG. 4, the switch 20 is connected to the cathode of the organic electroluminescent element 10. When the switch 20 is turned to the first potential (Vcc) from the second potential (GND), the organic electroluminescent element 10 is set to be in the reverse-bias state using the parasitic capacitance in the same way as in the circuit shown in FIG. 2.

C) Application of a Reverse Vias Voltage in the Circuit Shown in FIG. 13

Figure 5:
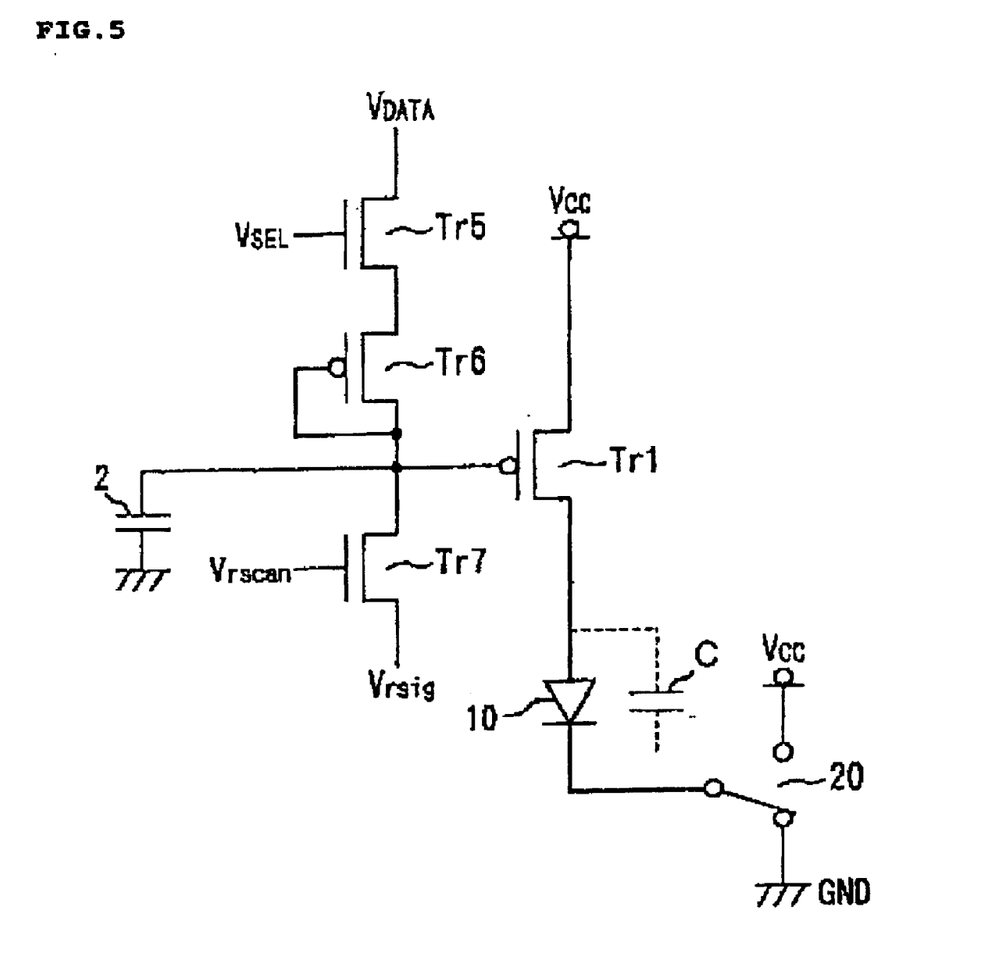
FIG. 5 is a schematic showing still another arrangement of the organic electroluminescent element driving circuit of the present invention.

The above-mentioned driving circuit shown in FIG. 13 may include the switch 20 to the cathode of the organic electroluminescent element 10 in the same way as in the circuit shown in FIG. 5. The switch 20 switches the cathode of the organic electroluminescent element from the first potential (Vcc) to the second potential (GND). Using the parasitic capacitance C, the organic electroluminescent element 10 is easily placed into the reverse-bias state.

B) Application of a Reverse-Bias Voltage To a Predetermined Group of Pixels

When a display device is constructed of the organic electroluminescent elements, the organic electroluminescent element corresponds to a single pixel. In the arrangements shown in FIG. 2 through FIG. 5, a switch is required for each organic electroluminescent element, i.e., for each pixel.

A) Application of a Reverse-Bias Voltage to Each Pixel

Figure 1:
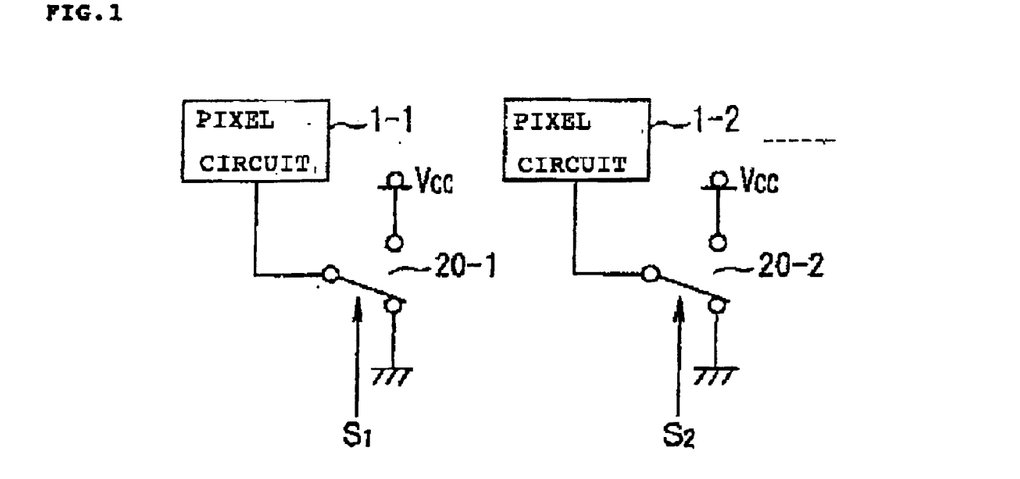
FIG. 1 is a schematic showing a driving circuit that drives organic electroluminescent elements in accordance with one embodiment of the present invention.

FIG. 1 shows the connection of pixel circuits 1-1, 1-2, . . . , each having the respective organic electroluminescent element, with the corresponding switches 20-1, 20-2, . . . .

As shown, the pixel circuit 1-1 having the respective organic electroluminescent element is provided with the switch 20-1, and the pixel circuit 1-2 is provided with the switch 20-2. Specifically, one pixel has its own switch having the above-referenced structure. These switches are respectively controlled by control signals S1 and S2. The control signals are input for a period of time except a duration of time during which the capacitor in each pixel circuit is charged and except a duration of time during which the organic electroluminescent element 10 emits light, thereby controlling the respective switches. In the embodiment shown in FIG. 4, a control signal S is easily generated referencing the selection voltage $V_{SEL}$ that determines the write period $T_W$ and the data hold control signal $V_{gp}$ that determines the display period $T_H$. Specifically, as shown in FIG. 6(a), the time other than the write period $T_W$ determined by the selection voltage $V_{SEL}$ and the display period $T_H$ determined by the data hold control signal $V_{gp}$ becomes a reverse-bias period $T_B$.

B) Application of a Reverse-Bias Voltage to Each Line

Figure 7:
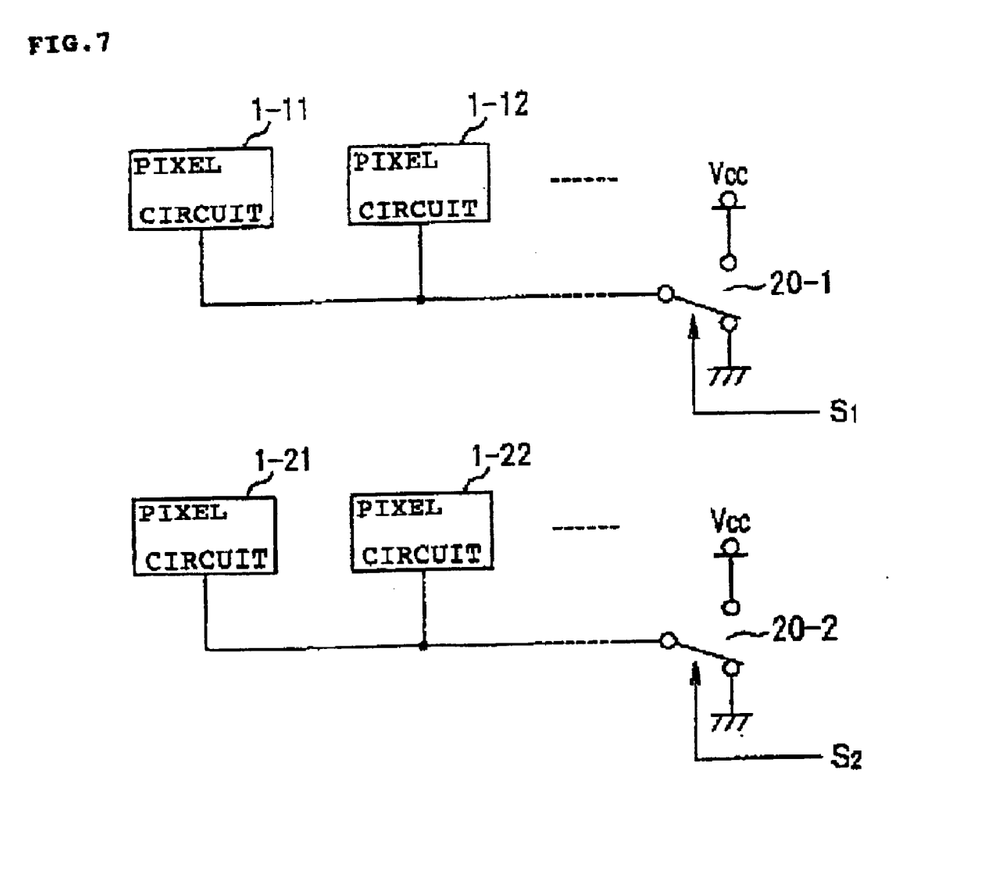
FIG. 7 is a schematic showing another embodiment of the organic electroluminescent element driving circuit of the present invention.

The above-referenced switch may be arranged for each line of pixels forming a display screen. Referring to FIG. 7, a switch 20-1 is arranged so that it is shared by pixel circuits 1-11, 1-12, . . . and a switch 20-2 is arranged so that it is shared by pixel circuits 1-21, 1-22, . . . When one switch is arranged for each line, the number of switches is smaller than in the circuit shown in FIG. 1. It is thereby possible to reduce costs.

Figure 6:
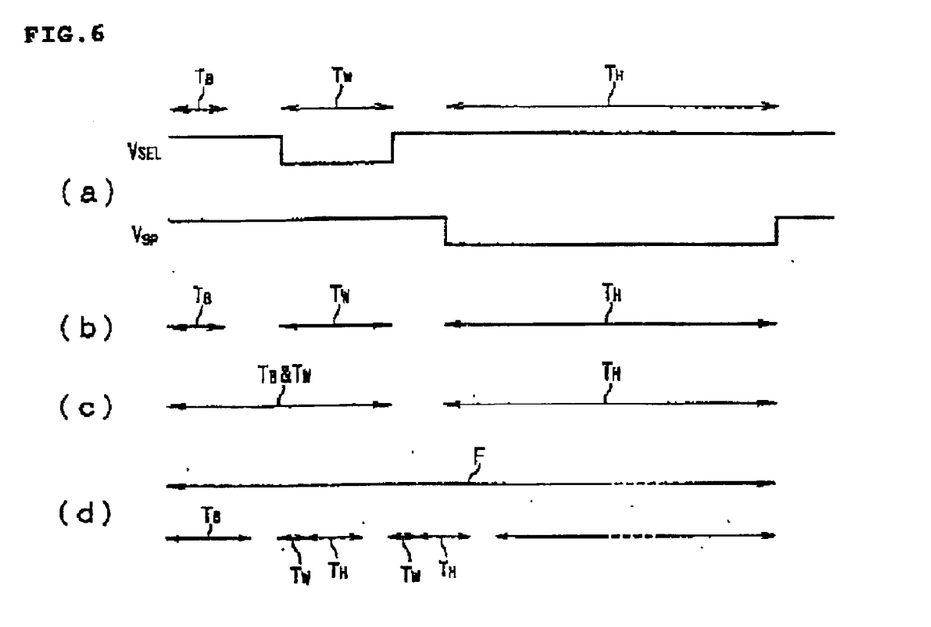
FIGS. 6(a)–6(d) is a waveform diagram showing the operation of the organic electroluminescent element driving circuit of the present invention.

If the pixels are reverse-biased on a line-by-line basis as shown in FIG. 6(b), a given line of pixels is in the reverse-bias period $T_B$, and the remaining lines of pixels are in either write period $T_W$ or the display period $T_H$. Since a plurality of lines forming the display screen are provided with the respective switches, the pixels are periodically set to be in the reverse-bias state on a line-by-line basis. The service life of the organic electroluminescent element is thus prolonged.

In the pixel circuit that permits the reverse-bias period $T_B$ and the write period $T_W$ to concurrently take place as shown in FIG. 6(c), a given line may be in the reverse-bias period $T_W$ or the write period $T_W$, and the remaining lines may be in the display period $T_H$.

C) Concurrent Application of a Reverse Bias to all Pixels

Figure 8:
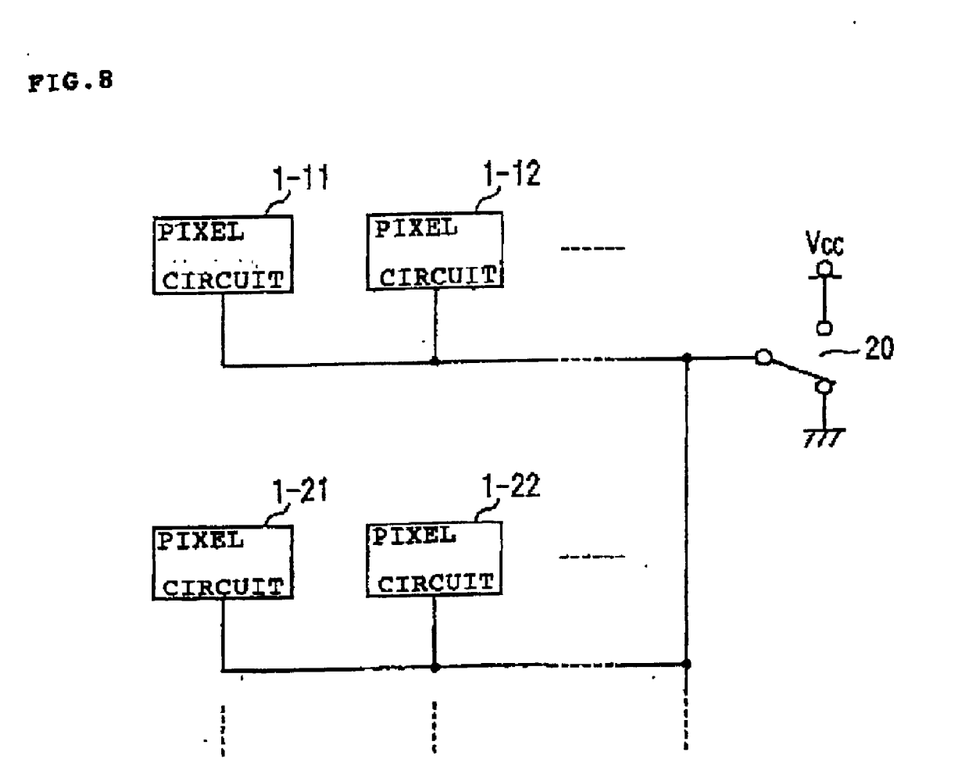
FIG. 8 is a schematic showing still another embodiment of the organic electroluminescent element driving circuit of the present invention.

A single switch is arranged for all pixels forming the display screen. By controlling the switch, the organic electroluminescent elements for all pixels forming the display screen are concurrently placed into the reverse-bias state. Referring to FIG. 8, a single switch 20 is shared by pixel circuits 1-11, 1-12, . . . , and pixel circuits 1-21, 1-22, . . . , and the switch 20 concurrently sets all pixels to be in the reverse-bias state. When the single switch is shared by all pixels, the number of switches is minimized, which makes it possible to reduce costs.

When all pixels are concurrently set to be in the reverse-bias state as shown in FIG. 6(d), the time length of the reverse-bias period $T_B$ is set so that the write period $T_W$ and the display period $T_H$ equal each other in one frame period F. Referring to FIG. 6(d), the reverse-bias period $T_B$ occurs first at the beginning of the frame period, followed by the write period $T_W$ and the display period TH. Alternatively, the reverse-bias period $T_B$ may be at any position within the frame period F.

D) Application of a Reverse-Bias Voltage to Only Particular Pixels

If a color display device employs the organic electroluminescent elements, particular organic electroluminescent materials that emit light of different colors, such as red, green, and blue, may be used. When different organic electroluminescent materials are employed, a difference in service life occurs therebetween. When the display device is constructed of a plurality of organic electroluminescent materials, any organic electroluminescent material having the shortest service life determines the service life of the display device. Reverse-biasing only the particular pixels is thus contemplated. In this case, the following two methods are available: (i) Only organic electroluminescent elements for the pixels having shorter life are reverse-biased; and (ii) The number of times a reverse bias is applied to the organic electroluminescent elements for the pixels having shorter life is set to be larger than the number of times the remaining organic electroluminescent elements will be reverse-biased. In this way, the service life of the entire display screen can be prolonged.

Some organic electroluminescent display device produces an area display that is presented on a portion of the display screen in a particular color, such as orange, blue, green, etc. In such a display device, only the organic electroluminescent elements having the shortest display life area may be reverse-biased. In this way, the service life of the display screen can be prolonged.

The driving circuit for the active-matrix display device that uses the organic electroluminescent elements has been discussed. The present invention is not limited to only this type of display device. For example, the present invention may be applied to an active-matrix display device employing an electro-optical element, other than the organic electroluminescent element, such as a TFT-LCD, an FED (Field Emission Display), an electrophoresis element, an electric field reversing element, a laser diode, or an LED.

Figure 15:
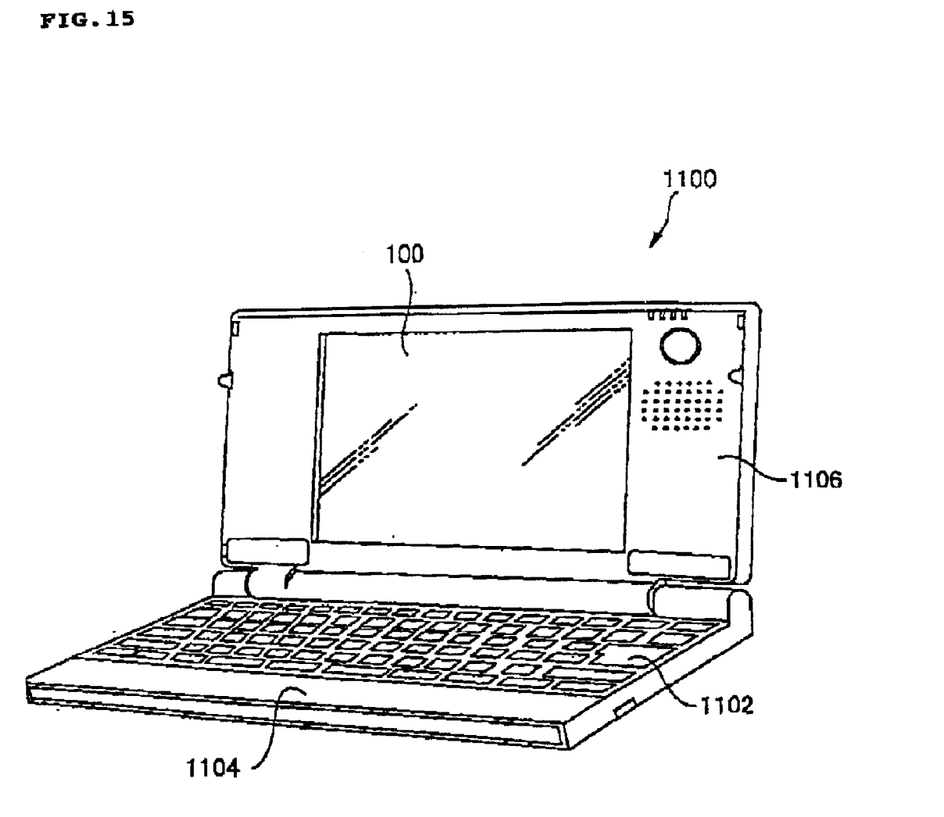
FIG. 15 is a perspective view showing the structure of a mobile personal computer as one example of electronic equipment that incorporates an active-matrix display device including a driving circuit of one embodiment of the present invention.

Several pieces of electronic equipment incorporating the active-matrix display device including the above-referenced driving circuit 1 will now be discussed. FIG. 15 shows a perspective view showing the structure of a mobile personal computer 1100 incorporating the active-matrix display device. As shown, the personal computer 1100 includes a main unit 1104 with a keyboard 1102, and a display unit 1106. The display unit 1106 includes the active-matrix display device 100

Figure 16:
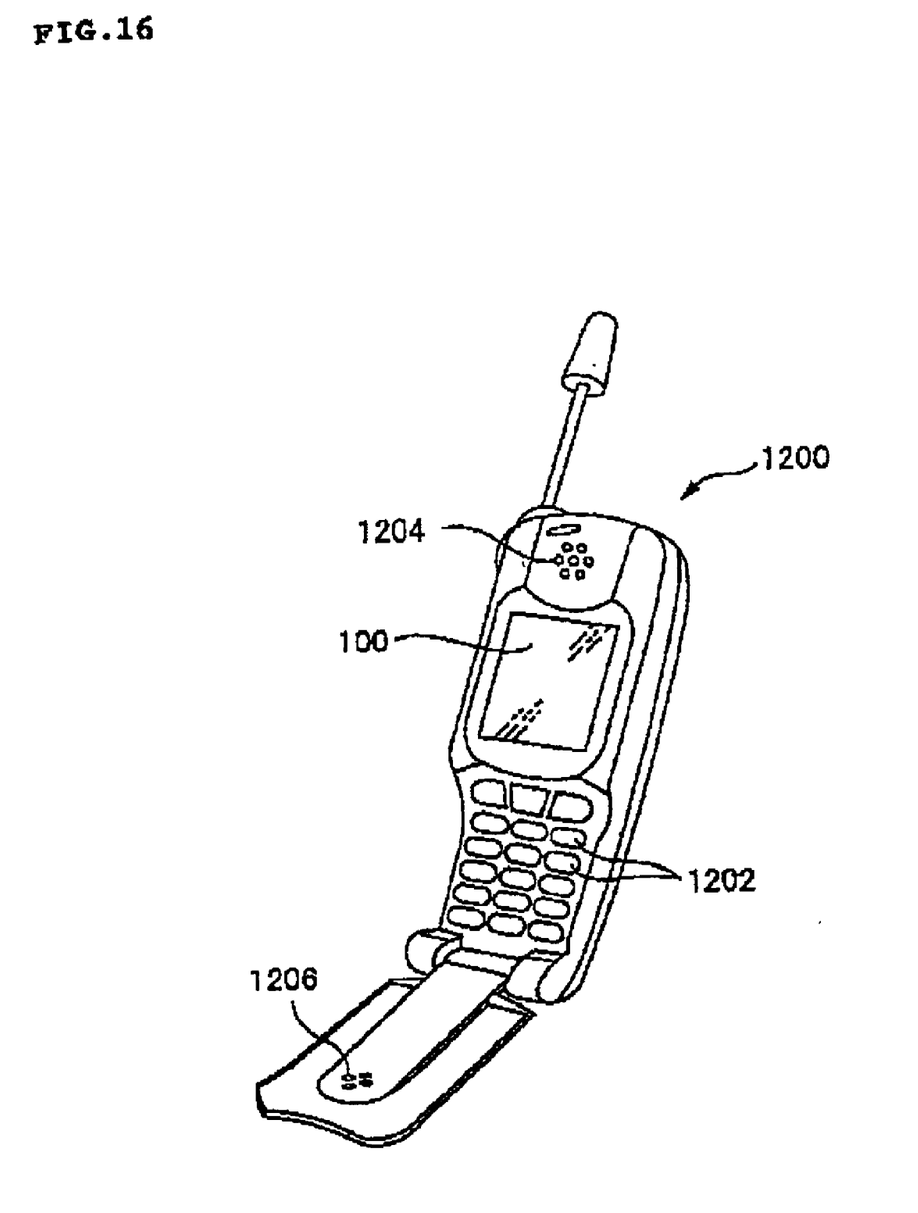
FIG. 16 is a perspective view showing the structure of a mobile telephone as one example of the electronic equipment that incorporates an active-matrix display device including a driving circuit of one embodiment of the present invention.

FIG. 16 is a perspective view showing the structure of a mobile telephone 1200 which incorporates the active-matrix display device 100 including the above-referenced driving circuit. As shown, the mobile telephone 1200 includes a plurality of control buttons 1202, an ear piece 1204, a mouth piece 1206, and the active-matrix display device 100.

Figure 17:
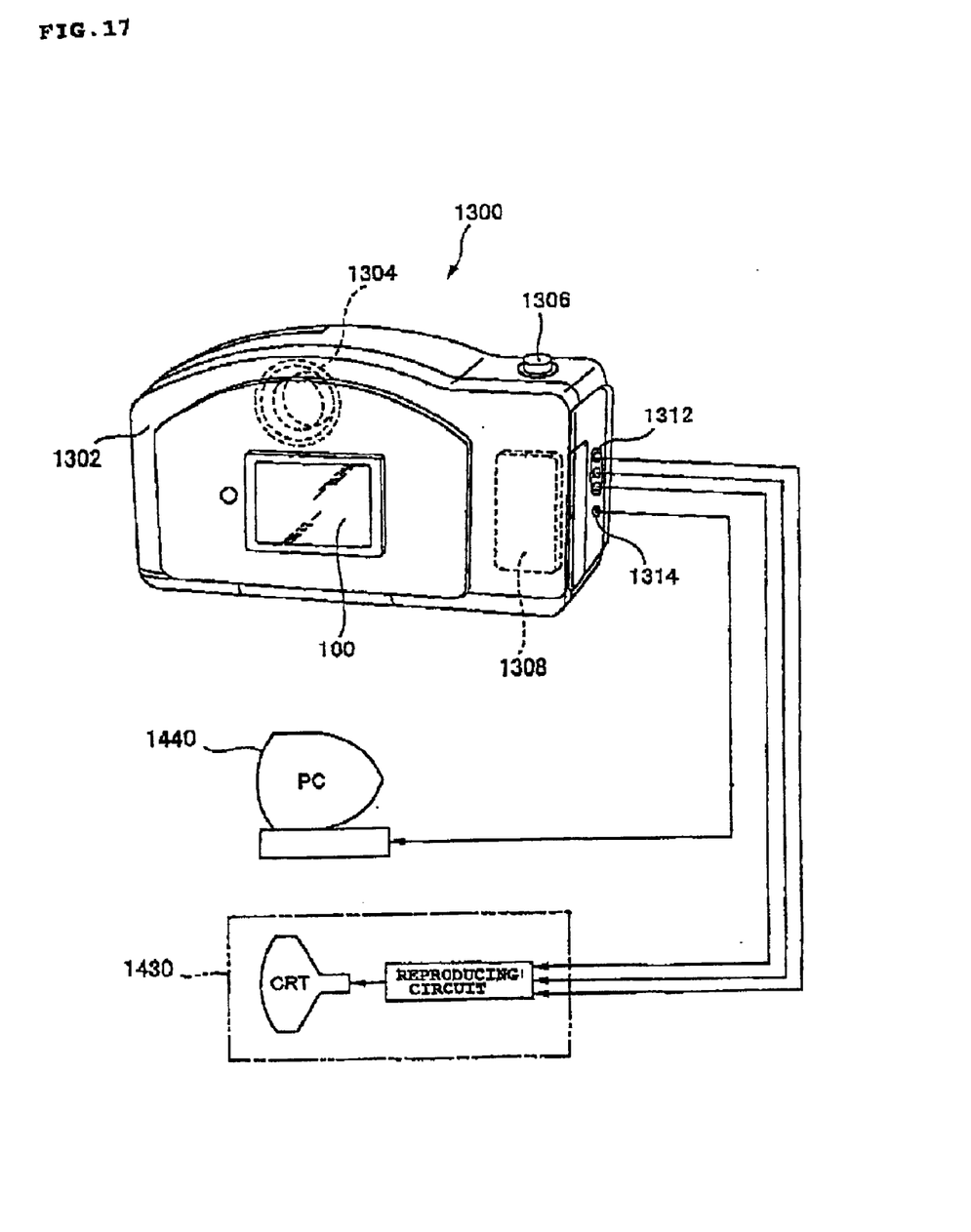
FIG. 17 is a perspective view showing the structure of a digital still camera as one example of the electronic equipment that incorporates an active-matrix display device including a driving circuit of one embodiment of the present invention.

FIG. 17 is a perspective view showing the structure of a digital still camera 1300 which incorporates the active-matrix display device 100, including the above-reference driving circuit, as a viewfinder. A simplified diagram of connections with external devices is also shown here. In contrast with a silver-film camera that exposes a film to an optical image of an object, the digital still camera 1300 generates a video signal by photoelectrically converting an optical image of an object through an image pickup device such as a CCD (Charge-Coupled Device). The above-referenced active-matrix display device 100 is mounted on the back of a case 1302 of the digital still camera 1300. The active-matrix display device 100 functions as a view finder to display the image of the object. Arranged on the front of the case 1302 (the far side of the case 1302 in FIG. 17) is a photodetector unit 1304 including an optical lens and the CCD.

When a photographer presses a shutter button 1306 after recognizing the image of an object displayed on the active-matrix display device 100, the image taken by the CCD at the moment is transferred to and stored in a memory on a circuit board 1308. The digital still camera 1300 is provided on the side of the case 1302 with a video signal output terminal 1312 and an input/output terminal 1314 for data exchange. As shown, as required, a television monitor 1430 is connected to the video signal output terminal 1312, and a personal computer 1440 is connected to the input/output terminal 1314 for data exchange. In response to predetermined operational steps, the video signal stored in the memory of the circuit board 1308 is output to the television monitor 1430 and the personal computer 1430.

Besides the personal computer shown in FIG. 15, the mobile telephone shown in FIG. 16, and the digital still camera shown in FIG. 17, the electronic equipment to which the active-matrix display device 100 of the present invention is applied may include any type of electronic equipment, including but not limited to liquid-crystal display television, a viewfinder type or direct monitoring type video cassette recorder, a car navigation system, a pager, an electronic pocketbook, an electronic tabletop calculator, a word processor, a workstation, a video phone, a POS terminal, and an apparatus having a touch panel, for example. The above-referenced active-matrix display device 100 is used as a display unit in each of the above electronic equipment.

In accordance with the present invention, the organic electroluminescent elements are set to be in the reverse-bias state on the basis of a group of predetermined pixels at a time, and the reverse-bias voltage can be applied without involving an increase in power consumption and an increase in layout space requirement. The service life of the organic electroluminescent element can be thereby prolonged. Using the parasitic capacitance, the reverse-bias voltage can be applied without the need for an additional power source. The service life of the organic electroluminescent element can be further prolonged.

What is claimed is:

1. A driving circuit for actively driving an organic electroluminescent display device in which a plurality of pixels, each containing an organic electroluminescent element, are arranged in a matrix, the driving circuit comprising:

a reverse-bias setting circuit which sets the organic electroluminescent elements to a reverse-bias state on an area-by-area basis, wherein a duration for writing to each pixel and a duration for setting the organic electroluminescent element for each pixel to the reverse-bias state are separately set.

2. The driving circuit according to claim 1, the reverse-bias setting circuit including a switch which switches an electrical connection state of at least one of electrodes of each of the organic electroluminescent elements between being connected to a first power source line that supplies a first potential and being connected to a second power source line that supplies a second potential that is lower in level than the first potential.

3. The driving circuit according to claim 2, the switches being arranged with one switch for each pixel, so that the organic electroluminescent elements being set to be in a reverse-bias state on a pixel-by-pixel basis by controlling the switches.

4. The driving circuit according to claim 2, the switches being arranged with one switch for each line of pixels, so that the organic electroluminescent elements are set to be in a reverse-bias state on a line-by-line basis by controlling the switches.

5. The driving circuit according to claim 2, the switch being arranged with a single switch for all pixels, so that the organic electroluminescent elements for all pixels are set to be in a reverse-bias state by controlling the switch.

6. The driving circuit according to claim 2, the switches being arranged with one switch for each of particular pixels, so that only the organic electroluminescent elements for the particular pixels are set to be in a reverse-bias state by controlling the switches.

7. The driving circuit according to claim 1, the reverse-bias setting circuit including a switch which switches an electrical connection state of a cathode of each of the organic electroluminescent elements between being connected to a first power source line that supplies a first potential and being connected to a second power source line that supplies a second potential that is lower in level than the first potential.

8. A piece of electronic equipment, comprising:
an active-matrix display device that includes the driving circuit according to claim 1.

9. A driving circuit for actively driving an organic electroluminescent display device in which a plurality of pixels, each containing an organic electroluminescent element, are arranged in a matrix, the driving circuit comprising:
a reverse-bias setting circuit which sets organic electroluminescent elements contained in a predetermined area, from among the organic electroluminescent elements, to a reverse-bias state, wherein a duration for writing to each pixel and a duration for setting the organic electroluminescent element for each pixel to the reverse-bias state are separately set.

10. A driving circuit for driving an electro-optical device in which a plurality of electro-optical elements are arranged in a matrix, the driving circuit comprising:
a reverse-bias setting circuit which sets at least one of the electro-optical elements to a reverse-bias state, wherein a duration for writing to each of a plurality of pixels and a duration for setting the electro-optical elements for each pixel to the reverse-bias state are separately set.

11. An electro-optical device, comprising:
a display device that includes a plurality of pixels, each of the plurality of pixels including an electro-optical element; and
a driving circuit that drives the display device, the driving circuit including a reverse-bias setting circuit which sets the electro-optical elements to a reverse-bias state on a predetermined area-by-area basis, wherein a duration for writing to each pixel and a duration for setting the electro-optical element for each pixel to the reverse-bias state, are separately set.

12. The electro-optical device according to claim 11, the reverse-bias setting circuit including a switch which switches an electrical connection state of at least one of electrodes of each of the electro-optical elements between being connected to a first power source line that supplies a first potential and being connected to a second power source line that supplies a second potential that is lower in level than the first potential.

13. The electro-optical device according to claim 12, the switches being arranged with one switch for each pixel, so that the electro-optical elements are set to be in a reverse-bias state on a pixel-by-pixel basis by controlling the switches.

14. The electro-optical device according to claim 12, the switches being arranged with one switch for each line of pixels, so that the electro-optical elements are set to be in a reverse-bias state on a line-by-line basis by controlling the switches.

15. The electro-optical device according to claim 12, the switch being arranged with a single switch for all pixels, so that the electro-optical elements for all pixels are set to be in a reverse-bias state by controlling the switch.

16. The electro-optical device according claim 12, the switches being arranged with one switch for each of particular pixels, so that only the electro-optical elements for the particular pixels are set to be in a reverse-bias state by controlling the switches.

17. The electro-optical device according to claim 11, the reverse-bias setting circuit including a switch which switches an electrical connection state of a cathode of each of the electro-optical elements between being connected to a first power source line that supplies a first potential and being connected to a second power source line that supplies a second potential that is lower in level than the first potential.

18. The electro-optical device according to claim 11, the electro-optical element being an organic electroluminescent element.

19. An electro-optical device, comprising:
a display device that includes a plurality of pixels, each of the plurality of pixels including an electro-optical element; and
a driving circuit that drives the display device, the driving circuit including a reverse-bias setting circuit which sets electro-optical elements contained in a predetermined area, from among the electro-optical elements, to a reverse-bias state, wherein a duration for writing to each pixel and a duration for setting the electro-optical element for each pixel to the reverse-bias state, are separately set.

20. An electro-optical device, comprising:
a plurality of electro-optical elements; and
a driving circuit that drives the plurality of electro-optical elements, the driving circuit including a reverse-bias setting circuit which sets at least one of the plurality of electro-optical elements to a reverse-bias state, wherein a duration for writing to each of a plurality of pixels and a duration for setting the electro-optical elements for each pixel to the reverse-bias state are separately set.

21. A driving circuit for actively driving an organic electroluminescent display device in which a plurality of pixels, each containing an organic electroluminescent element, are arranged in a matrix, the driving circuit comprising:
a reverse-bias setting circuit which sets the organic electroluminescent elements to a reverse-bias state on an area-by-area basis,
wherein while the organic electroluminescent elements in one line of pixels are set to the reverse-bias state, the organic electroluminescent elements in another line of pixels are not set to the reverse-bias state and writing to the lines of pixels are carried out.

22. An electro-optical device, comprising:
a display device that includes a plurality of pixels, each of the plurality of pixels including an electro-optical element; and
a driving circuit that drives the display device, the driving circuit including a reverse-bias setting circuit which sets the electro-optical elements to a reverse-bias state on a predetermined area-by-area basis,
wherein while the electro-optical elements in one line of pixels are set to the reverse-bias state, the electro-optical elements in another line of pixels are not set to the reverse-bias state and or writing to the lines of pixels are carried out.

* * * * *